US010638595B2

(12) United States Patent
Falkenburger (10) Patent No.: US 10,638,595 B2
(45) Date of Patent: Apr. 28, 2020

(54) ELECTRIC DEVICE WITH A HOUSING WITH PRESSING ELEMENTS (71) Applicant: Robert Bosch GmbH, Stuttgart (DE)

(72) Inventor: Andreas Falkenburger, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/324,631

(22) PCT Filed: Jul. 13, 2017

(86) PCT No.: PCT/EP2017/067676
§ 371 (c)(1),
(2) Date: Feb. 11, 2019

(87) PCT Pub. No.: WO2018/041457
PCT Pub. Date: Mar. 8, 2018

(65) Prior Publication Data
US 2019/0191541 A1    Jun. 20, 2019

(30) Foreign Application Priority Data

Sep. 2, 2016   (DE) .................. 10 2016 216 672

(51) Int. Cl.
*H05K 1/02* (2006.01)
*H02K 11/33* (2016.01)
(Continued)

(52) U.S. Cl.
CPC ............. *H05K 1/0201* (2013.01); *H02K 5/10* (2013.01); *H02K 11/33* (2016.01); *H05K 5/02* (2013.01);
(Continued)

(58) Field of Classification Search
CPC .................................................. H05K 1/0201
(Continued)

(56) References Cited

U.S. PATENT DOCUMENTS

| 7,557,442 B2 * | 7/2009 | Licht .................. H01L 23/3675 |
| | | 257/675 |
| 7,916,491 B2 * | 3/2011 | Fino .................... H05K 7/20854 |
| | | 174/520 |
| 2014/0054991 A1 * | 2/2014 | Hyodo ...................... F04C 2/18 |
| | | 310/71 |

FOREIGN PATENT DOCUMENTS

| DE | 196 00 619 A1 | 7/1997 |
| DE | 197 12 099 A1 | 5/1998 |
| DE | 10 2013 222 822 A1 | 5/2015 |

OTHER PUBLICATIONS

International Search Report corresponding to PCT Application No. PCT/EP2017/067676, dated Oct. 19, 2017 (German and English language document) (5 pages).

* cited by examiner

*Primary Examiner* — Mukundbhai G Patel
(74) *Attorney, Agent, or Firm* — Maginot, Moore & Beck LLP (57) ABSTRACT

The disclosure relates to an electric device. The electric device has a housing, at least one printed circuit board, and at least one heat sink. The housing encloses a cavity, and the printed circuit board is received in the cavity. The printed circuit board is connected to the heat sink so as to conduct heat. According to the disclosure, the housing has a housing cover, and the housing cover has at least one, two, or three pressing elements, in particular pressing bolts or pressing pins, which are mounted in a movable manner along the longitudinal axis transversely to an areal extension of the housing cover. The pressing element is designed to be inserted into the cavity and to be pressed against the printed circuit board directly or at least indirectly and thus press the printed circuit board against the heat sink.

18 Claims, 4 Drawing Sheets

(51) Int. Cl.
  *H05K 7/20* (2006.01)
  *H02K 5/10* (2006.01)
  *H05K 5/02* (2006.01)
  *H02K 9/22* (2006.01)
(52) U.S. Cl.
  CPC ............ *H05K 7/2049* (2013.01); *H02K 9/22* (2013.01); *H02K 2203/03* (2013.01)
(58) Field of Classification Search
  USPC ........................................................ 361/727
  See application file for complete search history.

ELECTRIC DEVICE WITH A HOUSING WITH PRESSING ELEMENTS

This application is a 35 U.S.C. § 371 National Stage Application of PCT/EP2017/067676, filed on Jul. 13, 2017, which claims the benefit of priority to Serial No. DE 10 2016 216 672.7, filed on Sep. 2, 2016 in Germany, the disclosures of which are incorporated herein by reference in their entirety.

BACKGROUND

The disclosure relates to an electric device. The electric device comprises a housing and at least one printed circuit board and at least one heat sink. The housing encloses a cavity, the printed circuit board being received in the cavity. Preferably, the printed circuit board is connected to the heat sink so as to conduct heat.

SUMMARY

According to the disclosure, the housing comprises a housing cover, the housing cover having at least one or more—for example two or three or more—pressing elements, in particular pressing bolts or pressing pins, which are mounted to be slidable transversely to a planar extent of the housing cover along the longitudinal axis. The pressing element is designed to be inserted into the cavity and to be pressed against the printed circuit board directly or at least indirectly and thus press the printed circuit board against the heat sink. By means of the pressing element, a tolerance of an arrangement of the printed circuit board in the cavity can advantageously be compensated for. Compared with pressing bolts which are for example molded on the housing cover, and thus have a fixed length, with a variable length of the pressing element, a force can be applied to the printed circuit board by means of a pressing tool. For example, the housing can thus be pressed, together with the printed circuit board and the heat sink, into another housing part, for example a housing of an electric motor. As a result, during the pressing of the housing onto the additional housing part, a strain is advantageously not placed on the housing cover.

Advantageously, the pressing element, for example a pressing bolt or a pressing pin—in the case where said element remains in the displacement position pressed into the cavity—can form a fixing means for retaining the printed circuit board.

Preferably, the pressing bolt has a round, in particular circular or elliptical cross section. As a result, the pressing bolt can be produced in a simple manner together with the housing cover, and good sealing with respect to the housing cover can be achieved. In another embodiment, the pressing bolt has a polygonal cross section, for example a triangular, square, pentagonal or hexagonal cross section. As a result, the pressing bolt can be formed with good rigidity along the longitudinal axis.

Preferably, a longitudinal portion of the pressing bolt, which forms part of an end portion protruding out of the housing cover, has a signal color. The signal color is for example red, yellow or orange. As a result, a human eye or detection device can easily discern, from outside, whether the pressing bolt is inserted into the housing, and the housing cover has thus been assembled correctly.

In one advantageous variant, the pressing bolt is designed to press directly against a housing base of the housing instead of against the printed circuit board. The printed circuit board can have for example a recess through which the pressing bolt can pass. As a result, during the pressing of the housing onto an additional housing part, a strain is advantageously placed only on the housing base of the housing.

In one preferred embodiment, a sliding bearing for the pressing bolt is formed in the housing cover. In this embodiment, the pressing bolt is preferably mounted so as to be able to slide back and forth in an aperture in the housing cover. The housing cover can thus advantageously form a joint assembly unit together with the pressing bolt as a pressing means.

In one preferred embodiment, the pressing bolt and the housing cover are each formed from plastics materials which are different from one another. The housing cover and the pressing bolt can thus for example be produced together in an injection molding tool, for example by means of IMA (IMA=in-mold assembly) or assembly injection molding. The plastics materials which are different from one another are preferably designed to remain separate from one another during the injection molding and thus to not fuse together or integrally bond to one another. As a result, the pressing bolt can advantageously be mounted so as to be able to slide back and forth in an aperture in the housing cover. Preferably, the pressing bolt is formed from POM (POM=polyoxymethylene), and the housing cover is formed from PBT (PBT=polybutylene terephthalate).

In one preferred embodiment, the pressing bolt has a greater modulus of elasticity than the housing cover. The pressing bolt can thus have a greater rigidity than the housing cover. For example, the pressing bolt has a tubular shape. As a result of the tubular shape, the pressing bolt can advantageously be provided in a simple manner.

Preferably, the pressing bolt and the housing cover are each formed from a thermoplastic. For example, the pressing bolt is formed from POM, PPS (PPS=polyphenylene sulfide) or PMMA (PMMA=polymethyl methacrylate). The housing cover is preferably formed from ABS (ABS=acrylonitrile butadiene styrene), polyamide, PBT, PEEK (PEEK=polyether ether ketone) or a polyalkene, for example polyethylene or polypropylene. The housing cover is preferably formed from a fiber-reinforced plastics material. The fibers are for example glass fibers or carbon fibers.

The pressing bolt can be for example inserted in an aperture in the housing cover in order to be connected to the housing cover. Preferably, the pressing bolt is designed to engage in the housing cover in an interlocking manner. For this purpose, the pressing bolt comprises at least one engagement hook or bayonet hook, which is designed to engage behind an aperture edge of the housing cover in an interlocking manner.

In another embodiment, the pressing bolt is formed from a thermoset, and the housing cover is formed from a thermoplastic. For this purpose, for example the housing cover can be produced in an assembly injection molding process after producing the pressing bolt.

Preferably, a melting temperature of the material of the pressing bolt is lower than a melting temperature of the material of the housing cover. Advantageously, the pressing bolt can thus be produced in the housing cover in a second injection process after the production of the housing cover, for example by means of IMA. As a result, during the production thereof in the aperture in the housing cover, the pressing bolt can reduce the volume thereof and thus shrink so that the pressing bolt in the housing cover can slide along the longitudinal axis thereof.

In another embodiment, the housing cover comprises a resiliently formed lip which is formed in the region of the pressing bolt, in particular a resilient lip or membrane which encloses the pressing bolt and connects said bolt to the housing cover. The pressing bolt is thus advantageously mounted in the housing cover so as to be able to slide back and forth in a resilient, axial manner. Preferably, the pressing bolt is connected to the resiliently formed lip at least in an adhesive manner, preferably in an integrally bonded manner, the lip being connected to the housing cover in the region of the aperture, in particular the aperture edge of the aperture, in an integrally bonded and/or interlocking manner. The lip can comprise a sealing edge for example for interlocking connection to the housing cover, which edge has a preferably peripherally formed groove which is designed to receive the aperture edge of the housing cover. Advantageously, the elastomer material of the resiliently formed lip is designed to be connected to the pressing bolt and the housing cover in an integrally bonded manner, in particular by fusing together or by polymer bonds, during the injection molding. The housing cover can thus be produced together with the lip and the pressing bolt in a multi-material injection molding process using plastics materials which are different from one another, for example a RIM process (RIM=reaction injection molding). The lip is formed for example from a silicone rubber.

In one preferred embodiment, the lip is integrally bonded, in particular fused, to the pressing bolt and the housing cover. The housing cover can thus advantageously be designed so as to be sealed against liquid media, for example water or oil.

In one preferred embodiment of the device, the printed circuit board is connected to the heat sink by a heat conducting means, in particular a heat-conductive adhesive or a heat-conductive paste. Thus, from electric components which produce waste heat, for example a power semiconductor which is connected to the printed circuit board, waste heat can be emitted from the power semiconductor—either through the printed circuit board or directly to the heat-conducting means and onwards to the heat sink.

The disclosure also relates to a method for pressing a printed circuit board onto a heat sink. During the method, the printed circuit board is introduced into a cavity in a housing. Preferably, the planar extent of the printed circuit board is arranged opposite a heat sink. The heat sink preferably forms at least part of the housing base or forms the housing base of the housing.

In another step, the housing is closed by a housing cover. Preferably, the housing cover is sealingly connected, for example bonded or laser-welded, to the housing, in particular a housing edge of the housing.

Preferably, at least one or more pressing bolts which are mounted in an axially slidable manner in the housing cover have a pressing force applied to the outwardly protruding end thereof from outside and are thus pressed into the cavity in the closed housing. In said cavity, the pressing bolt or the pressing bolts can press the printed circuit board against the heat sink. By means of the previously described assembly process, using the axially slidable pressing bolt, a tolerance dimension, in particular an installation dimension, which represents a distance of the printed circuit board from the housing cover, can be compensated for. Advantageously, the housing cover is thus not placed under a strain and thus is also not bent or damaged.

In one preferred embodiment of the method, the printed circuit board is connected to the heat sink so as to conduct heat as a result of being pressed by the pressing force. The printed circuit board can thus advantageously be connected to the heat sink in a simple and neat manner. Advanta-geously, in particular when pressing the printed circuit board against the heat sink, no foreign substances, for example dirt particles or metal residues or other contaminants, for example media such as oil or moisture, can penetrate into the housing and, in said housing, impair electrical functionality of the printed circuit board, in particular of a circuit arrangement formed by the printed circuit board, since the housing remains closed during the pressing. The housing can have for example a pressure-compensation aperture so that air located in the cavity can escape when the pressing bolts are being pressed in.

In one preferred embodiment, the pressing bolt ends flush with the housing cover after being pressed into the housing cover or is countersunk in the housing cover. Advantageously, it is thus easy to discern from outside whether the assembly process has been carried out completely and correctly, in particular whether the printed circuit board has been connected to the heat sink so as to conduct heat.

In one preferred embodiment of the method, while being pressed into the cavity, the pressing bolt slides in an aperture in the housing cover. The pressing bolt is advantageously connected to the housing cover before the housing cover is fitted and thus forms an assembly unit together with the housing cover. The housing can thus advantageously be assembled in a simple manner.

Preferably, the housing cover is produced together with the pressing bolt by means of an injection molding process, in particular assembly injection molding. The housing cover can thus advantageously be provided in a simple manner. Further advantageously, a precise fit of the pressing bolt in the aperture can thus be produced, a clearance between the pressing bolt and the housing cover when producing the pressing bolt being able to be determined by the shrinkage thereof during production.

Advantageously, after injecting the housing cover in an aperture in the housing cover, the pressing bolt can be produced by injection molding so that the longitudinal diameter of the pressing bolt can shrink to a predetermined final dimension, in particular become smaller, during the cooling and/or solidifying in the aperture. As a result, the pressing bolt can still be movable in the aperture. Preferably, a mold temperature of a mold producing the housing cover corresponds to the mold temperature of a mold producing the pressing bolt. The molds are for example each formed as in particular separable, and preferably heatable hollow molds.

In another embodiment, the pressing bolt bounces in an aperture in the housing cover while being pressed in, an integrally bonded connection between the pressing bolt and the housing cover remaining unchanged during the bouncing. The housing cover can thus advantageously be designed to be media-impermeable.

Preferably, while closing the cavity, the housing cover is bonded to the housing, in particular a housing edge of the housing, or laser-welded thereto by laser beams. The housing can thus advantageously be closed in a media-impermeable manner, in particular in an oil-tight or water-tight manner.

In one preferred embodiment, while pressing in the at least one pressing bolt or the pressing bolts, the housing is pressed, together with the cooling element, into another housing part, in particular a sleeve forming the housing part, for example a motor sleeve.

Advantageously, by means of only one pressing-in process, the printed circuit board can thus be connected to the heat sink, in particular a cooling element, so as to conduct heat and, by means of the same pressing-in process, the housing can be connected to, in particular plugged into, another housing part.

BRIEF DESCRIPTION OF THE DRAWINGS

The disclosure will now be explained in the following with reference to drawings and additional exemplary embodiments. Further advantageous embodiment variants result from a combination of the features shown in the drawings and described herein.

DETAILED DESCRIPTION

Figure 1:
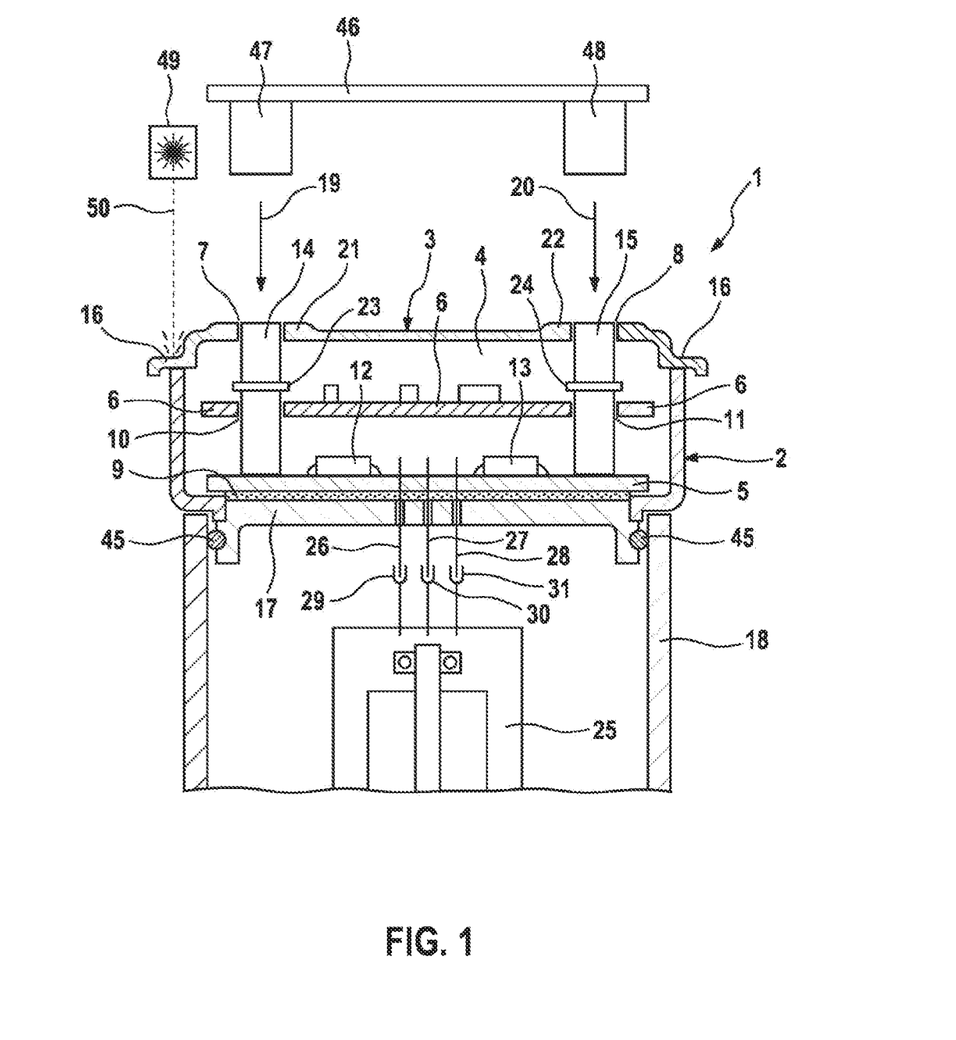
FIG. 1 shows an exemplary embodiment of an electric device, comprising a housing and a housing cover for the housing, wherein the housing cover has two slidably mounted pressing bolts for pressing onto a printed circuit board or a housing base.

FIG. 1 is a schematic sectional view of an exemplary embodiment of an electric device 1. The electric device 1 forms for example an electric machine, in particular an electric motor and/or a generator. The device 1 comprises a housing 2, which has a housing cover 3 and encloses a cavity 4 together with the housing cover 3. The device 1 also comprises at least one circuit carrier, in this exemplary embodiment a circuit carrier 5 and a circuit carrier 6, which are each arranged in the cavity 4.

In this exemplary embodiment, the device 1 also comprises a slidably mounted pressing bolt 14, which is mounted in an aperture 7 in the housing cover 3 so as to be slidable along the longitudinal extent thereof. The device 1 also comprises an additional pressing bolt 15, which is mounted on the aperture 8 in the housing cover 3 so as to be slidable along the longitudinal extent thereof. The pressing bolts 14 and 15 each form a pressing bolt for pressing onto the circuit carrier 5.

The device 1 can comprise additional pressing bolts in addition to the pressing bolts 14 and 15, and therefore the device 1 can comprise more than two pressing bolts, in particular three, four or five pressing bolts.

The circuit carrier 6 is arranged parallel to, and at a distance from, the circuit carrier 5 in the cavity 4, the pressing bolt 14 being guided through an aperture 10 in the circuit carrier 6, and the pressing bolt 15 being guided through an aperture 11 in the circuit carrier 6. The apertures 10 and 11 each have a greater diameter than the pressing bolts guided through the apertures in each case, and therefore the pressing bolts can be slidably moved in the apertures.

In this exemplary embodiment, the circuit carrier 5 comprises a semiconductor device 12 and a semiconductor device 13 which are connected, in this exemplary embodiment, soldered, to the circuit carrier. The semiconductor devices 12 and 13 are each designed to produce waste heat which can be conducted away through the circuit carrier 5 to a heat sink 17, which heat sink is formed in this exemplary embodiment by a cooling element, in particular an aluminum cooling element. The semiconductor devices 12 and 13 each form for example a semiconductor switch of a power output stage of the device 1. The heat sink 17, which in this exemplary embodiment is part of the device 1, is connected to the circuit carrier 5 by a heat-conducting means 9, for example a heat-conductive paste or a heat-conductive adhesive. The device 1 also comprises a housing part 18 which, in this exemplary embodiment, is formed by an in particular hollow cylindrical sleeve. In this exemplary embodiment, an electric motor 25 is received in the housing part 18. In this exemplary embodiment, the heat sink 17 forms a base of the housing 2. In this exemplary embodiment, the heat sink 17 comprises a groove for a peripherally formed elastomer seal 45. The housing 2 can thus be pressed into an opening in the housing part 18, at least part of the heat sink 17 protruding into the housing part 18, and the elastomer seal 45 sealing the heat sink 17 against a housing wall of the housing part 18.

To press the housing 2 together with the housing part 18, a force is required which can be applied to the pressing bolt 14 in the form of a force 19, and to the pressing bolt 15 in the form of a force 20. The force 19 and the force 20 are thus applied to the printed circuit board 5 by means of the pressing bolts 14 and so that the heat-conducting means 9, which is enclosed—in the manner of a sandwich—between the printed circuit board 5 and the heat sink 17 in the form of a cooling element, can connect the circuit carrier 5 to the heat sink 17 so as to conduct heat. After fitting the housing 2 onto a housing edge of the housing part 18, by applying the forces 19 and 20 to the pressing bolts 14 and 15, the housing 2 can be pressed into the housing part 18, wherein during the pressing in, the circuit carrier 5 is simultaneously pressed against the heat sink 17 so that a heat-conducting connection is produced between the circuit carrier 5 and the heat sink 17 by the heat-conducting means 9.

In this exemplary embodiment, the cover 3 comprises an edge 16 which is designed for bonding or laser-welding to the housing 2, in particular an edge of a housing wall of the housing 2. In this exemplary embodiment, the housing cover 3 comprises, in the region of the aperture 7, a reinforcing region, in particular a bead 21, and therefore the housing cover 3 has a greater thickness in the region of the aperture 7 than outside the bead 21. By means of the bead 21, a sliding bearing is formed for the pressing bolt 14. In the region of the aperture 8, the housing cover 3 comprises a bead 22 forming a thickness reinforcement which surrounds the aperture 8 so that an in particular hollow cylindrical sliding bearing is formed for the pressing bolt 15 by the bead 22.

In this exemplary embodiment, the pressing bolt 14 comprises a protrusion 23 which points transversely away from a longitudinal extent of the pressing bolt 14. In this exemplary embodiment, the protrusion 23 is formed by a peripherally formed collar. In this exemplary embodiment, the pressing bolt 14 has a cylindrical form. The protrusion 23 can be used to prevent the pressing bolt 14 from falling out of the housing 2 after an assembly of the housing 2. In this exemplary embodiment, the pressing bolt 15 comprises a collar-shaped protrusion 24 which is molded onto the pressing bolt 15 so as to point radially away from a longitudinal extent of the pressing bolt 15. The pressing bolt 15 thus cannot fall out of the housing 2.

In this exemplary embodiment, the device 1 also comprises three electrical connection lines 26, 27 and 28 which connect the circuit carrier 5 to the electric motor 25. The connection lines 26, 27 and 28 are each electrically connected to the circuit carrier 5 and extend through the heat-conducting means 9 and through an aperture in the heat sink 17, which aperture is formed in each case for the connection lines, into the cavity in the housing part 18, in which the electric motor 25 is received. The electric motor 25 can thus be energized by the power output stage, in particular the circuit carrier 5, via the connection lines. In this exemplary embodiment, the electric motor 25 comprises an insulation-displacement contact 29 for the connection line 26, an insulation-displacement contact 30 for the connection line 27, and an insulation-displacement contact 31 for the connection line 28. While pressing the housing 2 into the housing part 18, the connection lines 26, 27 and 28 can contact the electric motor 25 via the insulation-displacement contacts 29, 30 and 31.

In this exemplary embodiment, the electric motor 25 is in the form of a three-phase electric motor. In another embodiment, the electric motor 25 has more than three phases, for example five, six, twelve or eighteen phases.

The semiconductor devices 12 and 13 each form for example a power output stage for activating the electric motor 25.

A pressing device 46 is also shown, which comprises two pressing domes 47 and 48, and which is designed to apply the force 19 to an end of the pressing bolt 14 protruding out of the housing cover 3 by means of the pressing dome 47 and to apply the force 20 to an end of the pressing bolt 15 protruding out of the housing cover 3 by means of the pressing dome 48. Before or after pressing the housing 2 into the housing part 18 by means of the pressing device 46, the housing cover 3, in particular the edge 16, can be welded to the housing 2, in particular an opening edge of the housing 2, by means of laser beams 50 produced by a laser 49.

Figure 2:
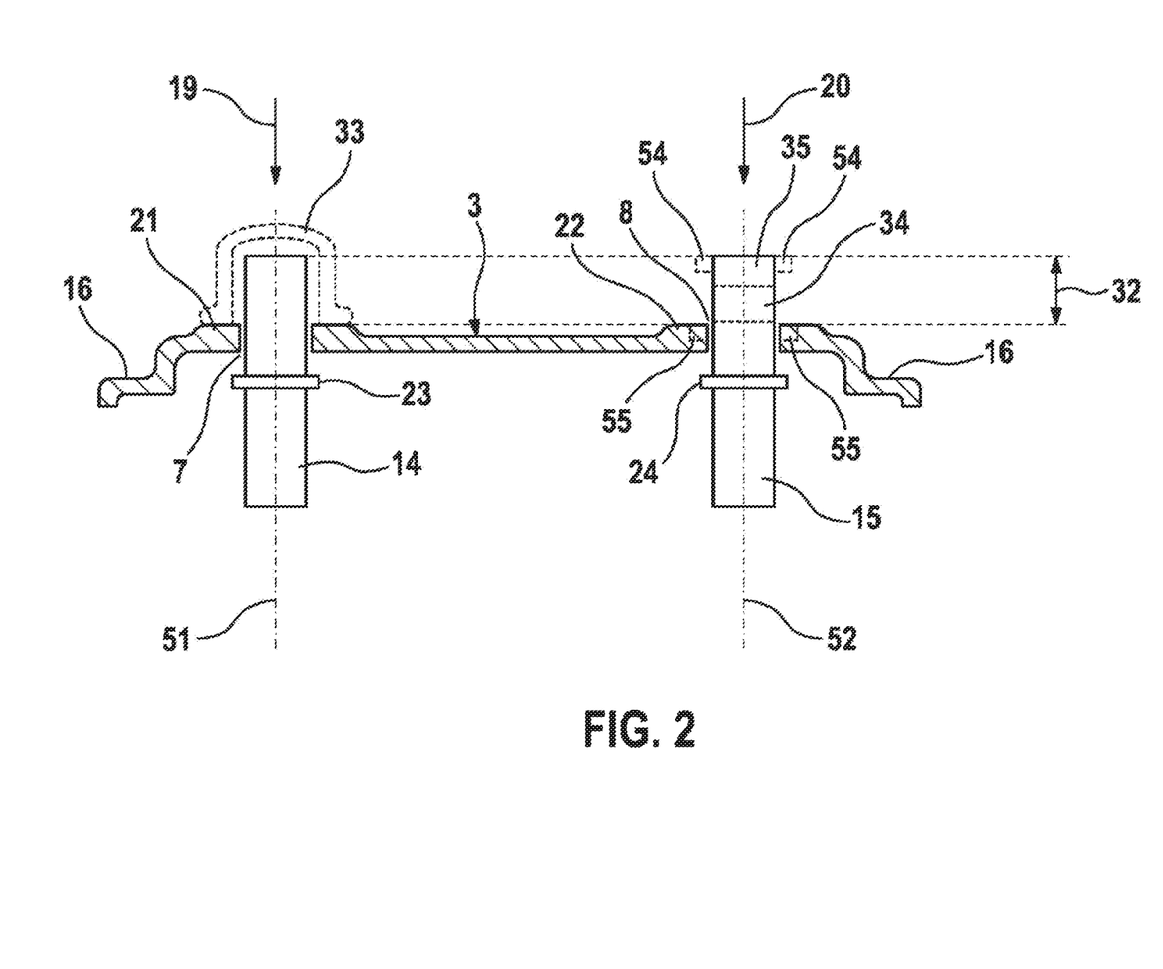
FIG. 2 is a sectional view of an exemplary embodiment of a housing cover, comprising pressing bolts which are mounted to be slidable along the longitudinal axis.

FIG. 2 is a schematic sectional view of the housing cover 3 in FIG. 1 shown already fitted onto the housing 2. In the view shown in FIG. 2, the pressing bolts 14 and 15 protrude out of the housing cover 3. The forces 19 and 20 can be applied to the pressing bolts 14 and 15 respectively, wherein the pressing bolts 14 and 15 can be slid in the apertures 7 and 8 along the longitudinal extents 51 and 52 thereof. Before the force 20 is applied to an end thereof protruding out of the housing cover 3, an end portion 32 of the pressing bolt 15 protrudes out of the housing cover 3 and the bead 22 surrounding the aperture 8. The end portion 32 of the pressing bolt 15 can thus be seen well even from a distance, and therefore it is easy to discern that, after fitting the housing 2 shown in FIG. 1 onto the housing part 18 of the device 1, the force 20 has not yet been applied to the above-mentioned end of the end portion 32.

A longitudinal portion 34 of the pressing bolt 15, which forms part of the end portion 32, has a signal color in this exemplary embodiment. The signal color is for example red, yellow or orange. As a result, the pressing bolt can easily be discerned from outside by a human eye. After inserting the end portion 32, the longitudinal portion 34 is received in the cavity 4, and therefore as a result of the invisibility of the signal color of the longitudinal portion 34 in a top view from outside of the housing cover 3, a correct assembly of the housing cover 3 together with the housing 2 can easily be recognized, for example by a human eye or by means of an electronic detection device.

In addition to or independently of the protrusion 24, on the bolt 15—indicated by dashed lines—an additional collar-shaped protrusion 54 can be formed so that the bolt is secured in the housing cover 3 against falling out. In the bead, a recess 55 corresponding to the protrusion 54 can be formed so that the bolt 15 can end flush with the housing cover 3 after being driven into the cavity 4. The pins 14 and 15 can each be hollow cylindrical at least on a longitudinal portion. As a result, material can advantageously be saved. Further advantageously, the pressing bolt can also be forcibly removed from the mold after injection molding by the collar formed by the protrusion 24 or 54, a wall, in particular a cylindrical wall, of the pressing bolt being able to deflect into the cavity of the hollow cylinder in the region of the protrusion 24 or 54.

The pressing bolts 14 and 15 can each be formed with or without the colored longitudinal portion 34.

The pressing bolts can each comprise two in particular collar-shaped protrusions which are at a distance from one another along the longitudinal extent of the pressing bolt, which protrusions enclose the aperture therebetween and are designed to interlockingly secure the pressing bolt against falling out of the housing cover.

FIG. 2 also shows a variant of the housing cover 3 shown as dashed lines. A resiliently formed closure cap 33 is shown as dashed lines, which cap encloses the end portion 32 of the pressing bolt 14. The resiliently formed closure cap 33 can be bonded for example to the housing cover 3, in particular the bead 21, by an adhesive or can be plugged into the bead 21. The closure cap 33 is designed to prevent penetration of media, in particular oil or water, into the cavity 4.

Figure 3:
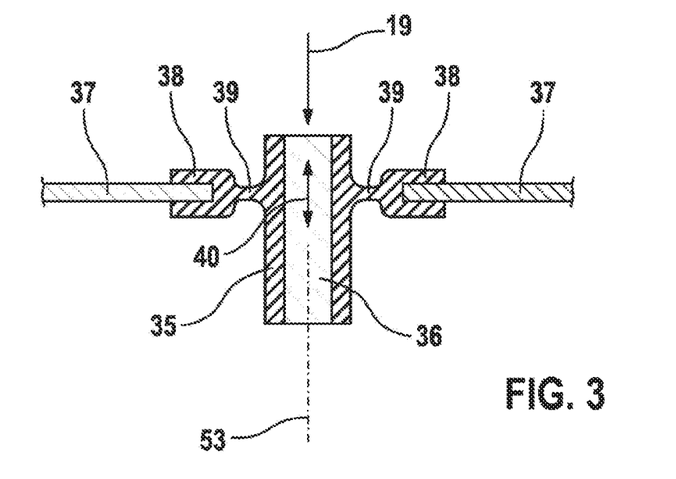
FIG. 3 shows a variant of a housing cover comprising a pressing bolt which is designed to be movable back and forth along the longitudinal axis in a resilient manner.

FIG. 3 is a schematic view of an embodiment of a housing cover 37 which is shown in part in a sectional view, which cover comprises a pressing bolt 35 which is mounted in the housing cover 37 so as to be slidable along a longitudinal extent 53 of the pressing bolt 35. The mounting of the pressing bolt 35 represents a variant of the sliding bearing of the pressing bolts 14 and 15 shown in FIGS. 1 and 2. The pressing bolt 35, which in this exemplary embodiment has a cylindrical form, is connected to the cover 37 by means of a resiliently formed lip 39. The resilient lip 39 opens out, pointing radially away from the longitudinal extent 53, into a peripherally formed collar 38, in which a groove for receiving an aperture edge of the cover 37 is formed. The pressing bolt 35 is thus mounted so as to be movable along the longitudinal axis of the longitudinal extent 53 and can thus carry out a back and forth movement 40 along the longitudinal extent 53.

The pressing bolt 35 can for example be part of the device 1 instead of the pressing bolt 14 in FIG. 1. To press the circuit carrier 5, the force 19 can be applied—for example by means of the pressing device 46—to an end of the pressing bolt 35 protruding out of the housing cover 37. The pressing bolt 35—held by the lip 39—can thus deflect along the longitudinal extent 53 into the cavity 4 and, in said cavity, transmit the force 19 to the circuit carrier 5.

The pressing bolt 35 can be produced together with the cover 37 for example by means of a multi-component injection molding process. The cover 37 can be formed for example from a thermoplastic. The pressing bolt 35 can be formed for example together with the sealing lip 39 and the collar 38 from an elastomer. The pressing bolt 35 can comprise for example a core 36 which is formed along the longitudinal extent 53 in the pressing bolt 35. In this exemplary embodiment, the core 36 is embedded in the elastomer material of the pressing bolt 35. The core 19 can thus act on the core 36, which has a greater rigidity than the elastomer material of the pressing bolt 35. The core 36 is formed for example from a plastics material having a greater rigidity than the pressing bolt 35, for example from a thermoset or from a metal or a ceramic material.

Figure 4:
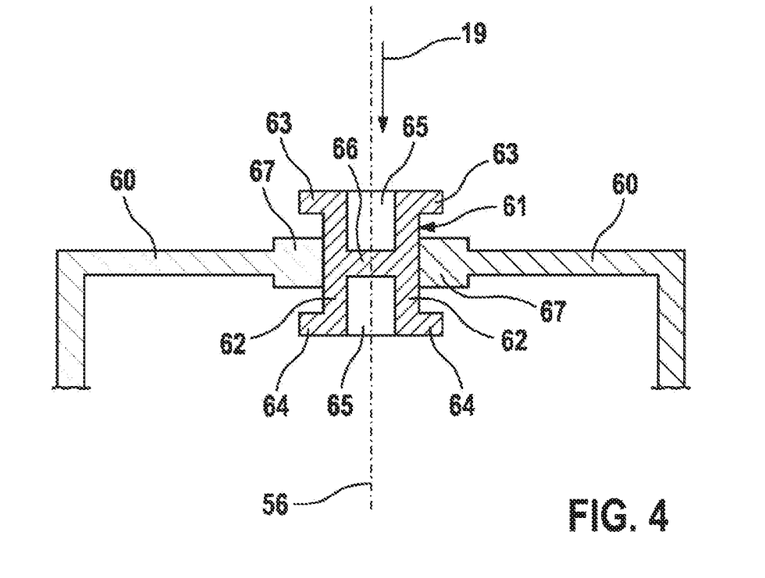
FIG. 4 shows an exemplary embodiment of a housing cover comprising a pressing element which is slidable in the housing cover along the longitudinal axis and is interlockingly secured in the housing cover.

FIG. 4 is a schematic sectional view of an exemplary embodiment of a housing cover 60. The housing cover 60 comprises a pressing bolt 61 which is mounted in an aperture of the housing cover 60 so as to be slidable along a longitudinal axis 56. The pressing bolt 61 comprises a sleeve 62 which is in particular hollow cylindrical and encloses a cavity 65. On two opposite ends of the pressing bolt 61, two collars 63 and 64 each extending transversely to the longitudinal axis 56 are molded, so that the pressing bolt 61 is interlockingly secured in the housing cover 60 along the longitudinal axis 56 and cannot fall out.

In the region of the aperture, the housing cover comprises a bead 67 reinforcing the housing cover, which bead surrounds the pressing bolt. A sliding bearing for the pressing bolt 61 is formed by the bead 67.

Inside the sleeve, a web 66 extends which supports the sleeve wall in the region of a center of the sleeve 62. The sleeve 62 can thus be pressed together on the collar 63 and/or the collar 64 and can deflect into the cavity 65. As a result, an injection molding tool producing the pressing bolt 61 can be removed along the longitudinal axis 56 against the undercut formed by the collar 63 or 64, and the pressing bolt can thus be forcibly removed from the mold. The housing cover 60 can be produced for example by means of assembly injection molding, the housing cover 60 being produced in a first step, and the pressing bolt 61 being produced in the aperture in a subsequent second step.

The pressing bolt is formed for example from POM, and the housing cover from fiber-reinforced PBT. The pressing bolt 61 can be implemented as part of the housing cover 3 in FIG. 1 instead of the pressing bolt 13 and/or 14.

The pressing bolt 60 can have a force 19 applied thereto and can be slid in the aperture along the longitudinal axis 56.

Figure 5:
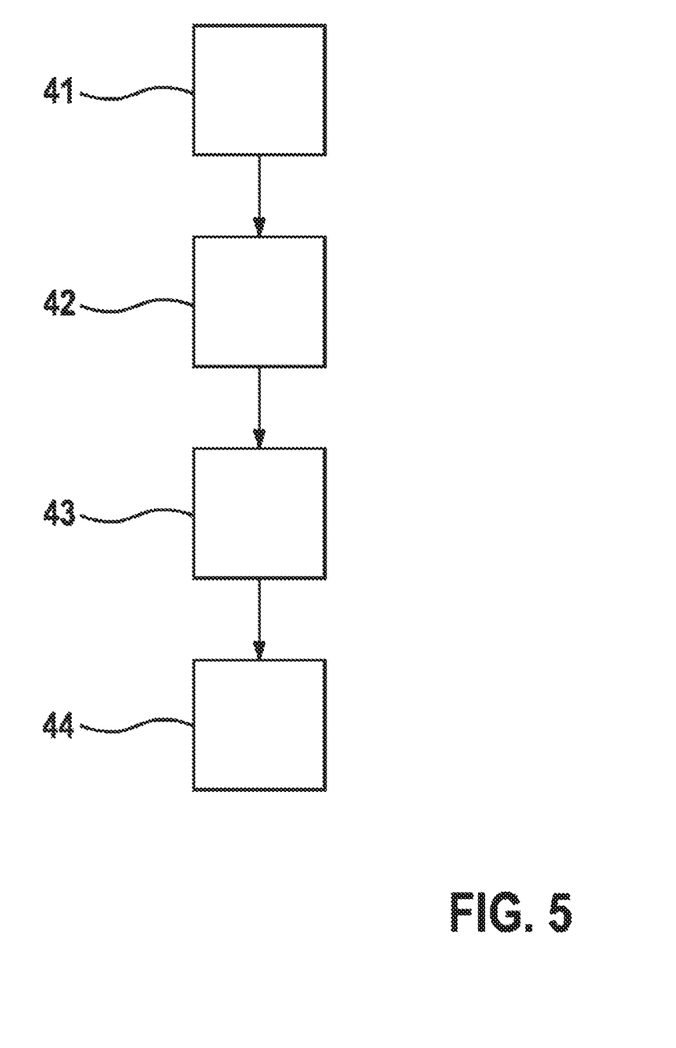
FIG. 5 shows an example of a method for producing an electric device, wherein, in the method, a housing is pressed into another housing part by means of slidably mounted pressing bolts and, in this process, a printed circuit board arranged inside the housing is pressed against a heat sink.

FIG. 5 shows a diagram for a method for producing an electric device such as the electric device 1 in FIG. 1, for example the electric motor shown in FIG. 1.

In a method step 41, a housing 2, in which a circuit carrier 5 is received, is fitted on another housing part 18. In another step 42, a housing cover in which at least one pressing bolt, for example the pressing bolts 14 and 15, is/are mounted so as to be slidable along the longitudinal axis, is fitted onto the housing 2 so that a housing opening of the housing 2 is closed. An end portion, for example the end portion 32 shown in FIG. 2, of the pressing bolt such as the pressing bolt 14 or the pressing bolt 15 protrudes out of the housing cover 3. In another step 43, the housing cover 3 is laser-welded to the housing 2 by means of laser beams, for example the laser beams 50 shown in FIG. 1. In another step 44, by means of a pressing device 46, a force, in particular the force 19 and/or the force 20, is applied to the at least one pressing bolt such as the pressing bolts 14 and 15 in FIG. 1 so that the pressing bolts are driven into the cavity 4, and an end thereof pointing into the cavity 4, which is opposite the end protruding out of the housing cover 3, is pressed onto the circuit carrier 5. The circuit carrier 5 is thus pressed against a heat sink, in particular the heat sink 17 shown in FIG. 1, so that a heat-conducting means, in particular a heat-conductive adhesive, or a heat-conductive paste, can fill a gap between the circuit carrier 5 and the heat sink 17 almost completely or completely. By the force 19 and/or the force 20, the housing 2, in particular the heat sink, for example the heat sink 17 shown in FIG. 1, can also be pressed with the additional housing part 18, in particular the motor sleeve shown in FIG. 1. Advantageously, when applying the force to the at least one pressing bolt, electric contacts which are connected to the circuit carrier, in particular the circuit carrier 5 in FIG. 1, are electrically connected to an electric machine, in particular an electric motor and/or generator. The electrical connection is for example an insulation-displacement connection or a plug-in connection.

The invention claimed is:

1. An electric device, comprising:
a housing enclosing a cavity;
at least one printed circuit board arranged in the cavity;
one heat sink, the printed circuit board configured to be pressed against the heat sink so as to conduct heat; and
at least one pressing bolt or pressing pin positioned at least partially within the cavity and slidable with respect to a housing cover of the housing along a longitudinal axis of the at least one pressing bolt or pressing pin in a direction transverse to a plane defined by the housing cover, the at least one pressing bolt or pressing pin configured to press against the printed circuit board directly or at least indirectly so as to press the printed circuit board against the heat sink.

2. The device as claimed in claim 1, wherein a sliding bearing for the at least one pressing bolt or pressing pin is formed in the housing cover.

3. The device as claimed in claim 1, wherein the at least one pressing bolt or pressing pin and the housing cover are each formed from plastics materials which are different from one another.

4. The device as claimed in claim 1, wherein the housing cover comprises a resiliently formed lip or membrane which is formed in a region of the at least one pressing bolt or pressing pin and encloses the at least one pressing bolt or pressing pin and connects said at least one pressing bolt or pressing pin to the housing cover so that the at least one pressing bolt or pressing pin is mounted in the housing cover so as to be able to slide in a resilient, axial manner along the longitudinal axis.

5. The device as claimed in claim 4, wherein the lip is integrally bonded to the at least one pressing bolt or pressing pin and the housing cover.

6. The device as claimed in claim 1, wherein the printed circuit board is connected to the heat sink by a heat-conducting structure, in particular a heat-conductive adhesive.

7. The device as claimed in claim 6, wherein the heat-conducting structure is a heat-conductive adhesive.

8. The device as claimed in claim 1, wherein the at least one pressing bolt or pressing pin includes at least two pressing bolts or pressing pins.

9. The device as claimed in claim 1, wherein the at least one pressing bolt or pressing pin is aligned with an opening in the housing cover.

10. The device as claimed in claim 1, wherein the at least one pressing bolt or pressing pin is positioned at least partly within an opening in the housing cover.

11. The device as claimed in claim 10, wherein:
the at least one pressing bolt or pressing pin includes a first collar extending transversely to the longitudinal axis at a location within the cavity;
the at least one pressing bolt or pressing pin includes a second collar extending transversely to the longitudinal axis at a location outside of the cavity; and
the at least one pressing bolt or pressing pin is secured within the opening by the first collar and the second collar.

12. The device as claimed in claim 10, further comprising:
a lip operably connected to the at least one pressing bolt or pressing pin and to the housing cover, the lip mounting the at least one pressing bolt or pressing pin to the housing cover while permitting movement of the at least one pressing bolt or pressing pin with respect to the housing cover.

13. A method for pressing a printed circuit board onto a heat sink, comprising:
introducing the printed circuit board into a cavity in a housing, wherein in said cavity, the planar extent of said printed circuit board is opposite a heat sink which forms at least part of a housing base of the housing;
closing the housing with a housing cover after introducing the printed circuit board into the cavity; and
applying a pressing force, from outside of the cavity after the housing is closed, to an end of at least one pressing bolt protruding outwardly from the housing cover such that the at least one pressing bolt slides with respect to the housing cover in a direction into the cavity and presses the printed circuit board against the heat sink.

14. The method as claimed in claim 13, wherein the printed circuit board is connected to the heat sink so as to conduct heat while being pressed onto said heat sink.

15. The method as claimed in claim 13, further comprising terminating the pressing force with the at least one pressing bolt flush with the housing cover.

16. The method as claimed in claim 13, wherein the applying of the pressing force further comprises sliding the at least one pressing bolt with respect to an aperture in the housing cover in which the at least one pressing bolt is located while being pressed into the cavity.

17. The method as claimed in claim 13, wherein the applying of the pressing force further comprises pressing the housing, together with the heat sink, into a sleeve forming a housing part.

18. The method as claimed in claim 17, wherein the housing part is a motor sleeve.

* * * * *